United States Patent
Tsuchiya

(10) Patent No.: US 10,679,862 B2
(45) Date of Patent: Jun. 9, 2020

(54) CONTACTLESS ELECTRIC POWER SUPPLY MECHANISM AND METHOD FOR ROTARY TABLE, AND WAFER ROTATING AND HOLDING DEVICE

(71) Applicant: MIMASU SEMICONDUCTOR INDUSTRY CO., LTD., Gunma (JP)

(72) Inventor: Masato Tsuchiya, Gunma (JP)

(73) Assignee: MIMASU SEMICONDUCTOR INDUSTRY CO., LTD., Takasaki-shi (JP)

( * ) Notice: Subject to any disclaimer, the term of this patent is extended or adjusted under 35 U.S.C. 154(b) by 51 days.

(21) Appl. No.: 16/094,383

(22) PCT Filed: Mar. 29, 2017

(86) PCT No.: PCT/JP2017/012792
§ 371 (c)(1),
(2) Date: Oct. 17, 2018

(87) PCT Pub. No.: WO2017/183402
PCT Pub. Date: Oct. 26, 2017

(65) Prior Publication Data
US 2019/0148154 A1    May 16, 2019

(30) Foreign Application Priority Data

Apr. 21, 2016 (JP) ................. 2016-085365

(51) Int. Cl.
*H01L 21/306* (2006.01)
*H02J 50/12* (2016.01)
(Continued)

(52) U.S. Cl.
CPC ............ *H01L 21/306* (2013.01); *H01L 21/31* (2013.01); *H01L 21/32055* (2013.01);
(Continued)

(58) Field of Classification Search
CPC .. H01L 2224/11; H01L 21/3065; H01L 24/11; H01L 24/741; H01L 21/6704
See application file for complete search history.

(56) References Cited

U.S. PATENT DOCUMENTS

| | | |
|---|---|---|
| 2008/0023141 A1 | 1/2008 | Shimizu et al. |
| 2010/0164295 A1 | 7/2010 | Ichikawa et al. |
| | (Continued) | |

FOREIGN PATENT DOCUMENTS

| | | |
|---|---|---|
| CN | 103812228 A | 5/2014 |
| JP | H06-232047 A | 8/1994 |
| | (Continued) | |

*Primary Examiner* — Jaehwan Oh
(74) *Attorney, Agent, or Firm* — McGlew and Tuttle, P.C.

(57) ABSTRACT

Provided are a contactless electric power supply mechanism and method for a rotary table, and a wafer rotating and holding device, which enable a load connected to the rotary table of the wafer rotating and holding device to be contactlessly supplied with electric power. The contactless electric power supply mechanism for a rotary table of a wafer rotating and holding device comprises: a rotary shaft; a rotary table, which is placed on an end of the rotary shaft, and is configured to hold a wafer on an upper surface of the rotary table; a drive motor configured to supply motive power to the rotary shaft; a fixed-side primary coil wound around the rotary shaft; an electric power supply source connected to the fixed-side primary coil; a rotary table-side secondary coil, which is provided so as to correspond to the fixed-side primary coil and be separated from the fixed-side primary coil by a predetermined distance, and is mounted to the rotary table; and a load connected to the rotary table-side secondary coil. In the contactless electric power supply mechanism for a rotary table, the load is supplied with electric power via the secondary coil by electromagnetic induction.

13 Claims, 3 Drawing Sheets

(51) Int. Cl.
*H01L 21/687* (2006.01)
*H01L 21/683* (2006.01)
*H01L 21/31* (2006.01)
*H01L 21/3205* (2006.01)

(52) U.S. Cl.
CPC ...... *H01L 21/683* (2013.01); *H01L 21/68764* (2013.01); *H01L 21/68785* (2013.01); *H01L 21/68792* (2013.01); *H02J 50/12* (2016.02)

(56) References Cited

U.S. PATENT DOCUMENTS

| | | | |
|---|---|---|---|
| 2013/0337635 A1 | 12/2013 | Yamawaku et al. | |
| 2014/0125141 A1 | 5/2014 | Shinohe et al. | |
| 2015/0083042 A1* | 3/2015 | Kobayashi | H01J 37/32082 118/500 |
| 2019/0295879 A1* | 9/2019 | Mashimo | H01L 21/027 |

FOREIGN PATENT DOCUMENTS

| | | |
|---|---|---|
| JP | 2004 241492 A | 8/2004 |
| JP | 2008-034463 A | 2/2008 |
| JP | 2008-103521 A | 5/2008 |
| JP | 4111479 B2 | 7/2008 |
| JP | 4257816 B2 | 4/2009 |
| JP | 4364242 B2 | 11/2009 |
| JP | 4625495 B2 | 2/2011 |
| JP | 2014-96612 A | 5/2014 |
| JP | 2014-135464 A | 7/2014 |
| JP | 2017 208513 A | 11/2017 |
| KR | 10-2013-0141397 A | 12/2013 |
| TW | 201413048 A | 4/2014 |

* cited by examiner

CONTACTLESS ELECTRIC POWER SUPPLY MECHANISM AND METHOD FOR ROTARY TABLE, AND WAFER ROTATING AND HOLDING DEVICE

TECHNICAL FIELD

The present invention relates to a contactless electric power supply mechanism and method for a rotary table of a wafer rotating and holding device, and to a wafer rotating and holding device.

BACKGROUND ART

Hitherto, in semiconductor manufacturing processes, there are an increasing number of steps in which various kinds of processing are performed while a semiconductor wafer made of, for example, silicon is rotated, such as spin etching, spin drying, and spin coating. As specific devices, there are known wafer rotating and holding devices such as a spin etching device, a spin drying device, and a spin coating device. Further, as examples of processing to be performed on a wafer surface in manufacturing processes for a device, there can be given, in addition to etching processing for removing a damaged layer after back-grinding, applying developer to the wafer, developing processing on the wafer, which has a surface that has circuit patterns exposed thereon and is applied with developer, and which is printed with a semiconductor circuit, cleaning the wafer surface, and the like. As such a wafer rotating and holding device and method used for performing spin processing on a wafer, there are given, for example, devices and methods described in Patent Documents 1 to 4.

In those wafer rotating and holding devices, it is required to supply electric power to a mechanism for performing processing on a wafer on the rotary table in addition to electric power supply for rotating the rotary table.

In recent years, processing performed on a wafer on the rotary table has also become complicated, and hence it is required to use various control devices and electric power devices.

PRIOR ART DOCUMENTS

Patent Documents

Patent Document 1: JP 4625495 B2
Patent Document 2: JP 4111479 B2
Patent Document 3: JP 4257816 B2
Patent Document 4: JP 4364242 B2

SUMMARY OF THE INVENTION

Problems to be Solved by the Invention

The present invention has been made in view of the above-mentioned related art, and it is an object of the present invention to provide a contactless electric power supply mechanism and method for a rotary table, and a wafer rotating and holding device, which enable a load connected to the rotary table of the wafer rotating and holding device to be contactlessly supplied with electric power.

Means for Solving Problems

In order to solve the above-mentioned problem, a contactless electric power supply mechanism for a rotary table according to the present invention is a contactless electric power supply mechanism for a rotary table of a wafer rotating and holding device, and comprises: a rotary shaft; a rotary table, which is placed on an end of the rotary shaft, and is configured to hold a wafer on an upper surface of the rotary table; a drive motor configured to supply motive power to the rotary shaft; a fixed-side primary coil wound around the rotary shaft; an electric power supply source connected to the fixed-side primary coil; a rotary table-side secondary coil, which is provided so as to correspond to the fixed-side primary coil and be separated from the fixed-side primary coil by a predetermined distance, and is mounted to the rotary table; and a load connected to the rotary table-side secondary coil. In the contactless electric power supply mechanism for a rotary table, the load is supplied with electric power via the rotary table-side secondary coil by electromagnetic induction.

The load preferably comprises a wafer processing mechanism for performing processing on a wafer placed on the rotary table.

The contactless electric power supply mechanism for a rotary table preferably further comprises: a first resonant capacitor connected to the fixed-side primary coil; and a second resonant capacitor connected to the rotary table-side secondary coil.

A contactless electric power supply method for a rotary table according to the present invention comprises supplying electric power to the load with use of the above-mentioned contactless electric power supply mechanism for a rotary table.

A wafer rotating and holding device according to the present invention comprises the above-mentioned contactless electric power supply mechanism for a rotary table.

The wafer rotating and holding device preferably further comprises a spin processing mechanism.

Advantageous Effects of the Invention

According to the present invention, there is obtained a remarkable effect of enabling provision of the contactless electric power supply mechanism and method for a rotary table, and the wafer rotating and holding device, which enable the load connected to the rotary table of the wafer rotating and holding device to be contactlessly supplied with electric power.

MODES FOR CARRYING OUT THE INVENTION

Embodiments of the present invention are described below, but those embodiments are described as examples, and hence it is to be understood that various modifications may be made thereto without departing from the technical idea of the present invention. In addition, the same members are denoted by the same reference symbols.

Figure 1:
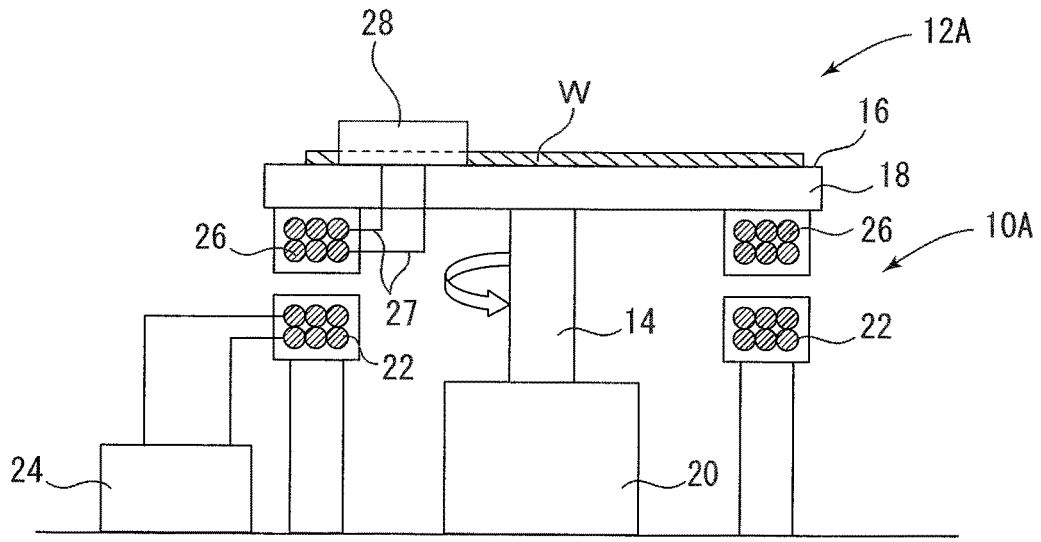
FIG. 1 is a schematic diagram for illustrating a wafer rotating and holding device comprising one embodiment of a contactless electric power supply mechanism for a rotary table according to the present invention.

In FIG. 1, a contactless electric power supply mechanism for a rotary table according to the present invention is denoted by a reference symbol 10A. The contactless electric power supply mechanism 10A for a rotary table is a contactless electric power supply mechanism for a rotary table of a wafer rotating and holding device 12A, and comprises: a rotary shaft 14; a rotary table 18, which is placed on an end of the rotary shaft 14, and is configured to hold a wafer W on an upper surface 16 thereof; a drive motor 20 configured to supply motive power to the rotary shaft 14; a fixed-side primary coil 22 wound around the rotary shaft 14; an electric power supply source 24 connected to the fixed-side primary coil 22; a rotary table-side secondary coil 26, which is provided so as to correspond to the fixed-side primary coil 22 and be separated from the fixed-side primary coil 22 by a predetermined distance, and is mounted to the rotary table 18; and a load 28 connected to the rotary table-side secondary coil 26. In the contactless electric power supply mechanism for a rotary table, the load 28 is supplied with electric power via the secondary coil 26 by electromagnetic induction. As the wafer W, a semiconductor wafer, for example, a silicon wafer, is used.

In the example illustrated in FIG. 1, the rotary shaft 14 is made of stainless steel (SUS), and the rotary table 18 is made of synthetic resin, for example, industrial plastic.

The electric power supply source 24 is preferred to be a high-frequency power supply. The frequency of the high-frequency power supply is preferred to be 20 kHz or higher.

The fixed-side primary coil 22 corresponds to a coil of an electric power transmission side, and the rotary table-side secondary coil 26 corresponds to a coil of an electric power reception side. In FIG. 1, there is illustrated an example in which the rotary table-side secondary coil 26 is provided above the fixed-side primary coil 22 so as to be separated from the fixed-side primary coil 22 by a predetermined distance.

In one embodiment of the present invention, there is obtained an advantage in that contact noise is not generated because electric power supply to the load 28 is contactlessly performed, and hence the number of rotations of the rotary table 18 may be increased to be infinite. In a contact-type electric power supply mechanism, the contact between wirings inside and outside of the rotary shaft 14 is required to be maintained, and hence there arise problems of the contact of the wirings and the number of rotations of the rotary table 18 being limited by an upper limit. In one embodiment of the present invention, in contrast, such problems do not arise.

The load 28 is suitably a wafer processing mechanism for performing processing on the wafer W placed on the rotary table 18. With this configuration, it is possible to contactlessly supply electric power to the wafer processing mechanism for performing processing on the wafer on the rotary table of the wafer rotating and holding device.

Examples of the wafer processing mechanism comprise an etching processing mechanism, a drying mechanism, and a coating mechanism in a spin etching device, a spin drying device, and a spin coating device, respectively. As other wafer processing mechanisms, there can be given, as processing to be performed on a wafer surface in manufacturing processes for a device, in addition to the etching processing mechanism for removing a damaged layer after back-grinding, a mechanism for applying developer to the wafer, a mechanism for performing developing processing on the wafer, which has a surface that has circuit patterns exposed thereon and is applied with developer, and which is printed with a semiconductor circuit, and a mechanism for cleaning the wafer surface, and the like.

Figure 2:
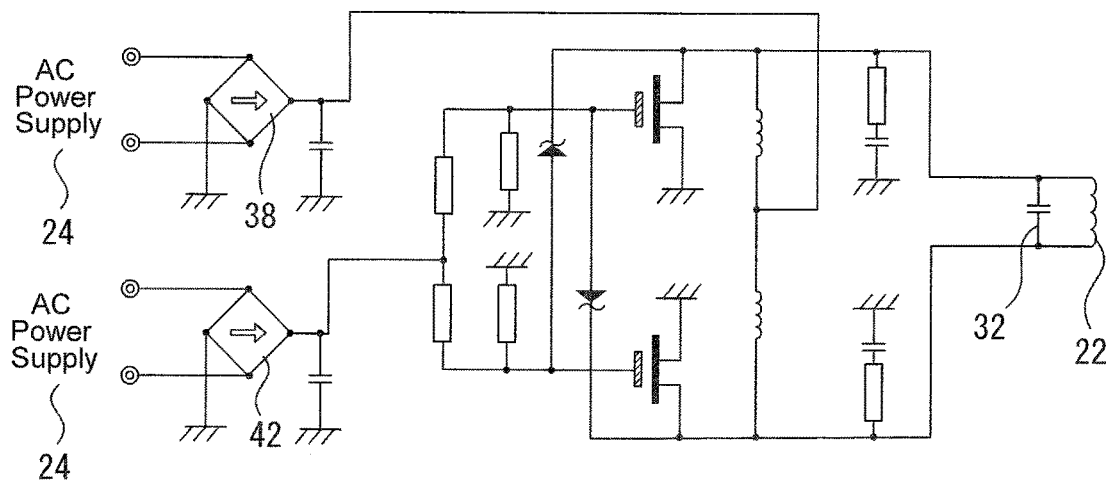
FIG. 2 is a basic circuit diagram of an electric power transmission side of the contactless electric power supply mechanism for a rotary table according to the present invention.
Figure 3:
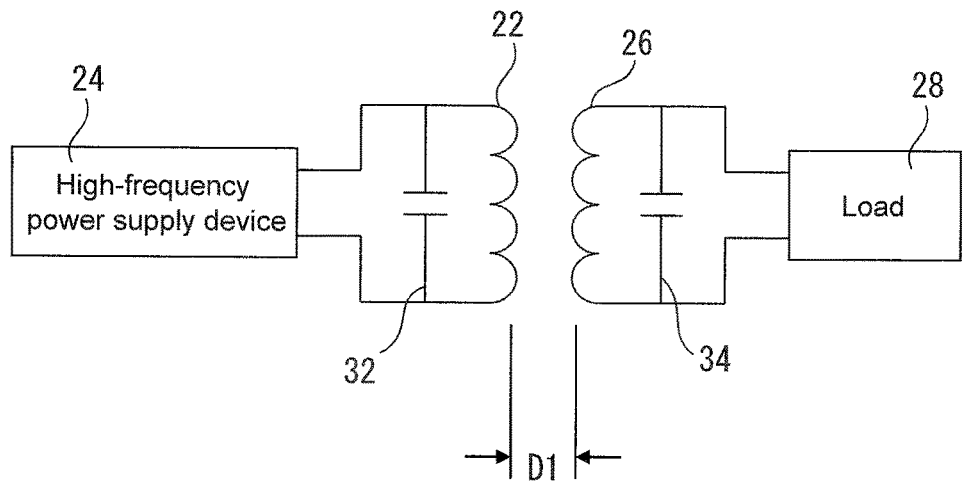
FIG. 3 is a block circuit diagram of the electric power transmission side and an electric power reception side of the contactless electric power supply mechanism for a rotary table according to the present invention.

FIG. 2 is a basic circuit diagram of the electric power transmission side, on which the fixed-side primary coil 22 is arranged. FIG. 3 is a block circuit diagram of the electric power transmission side and the electric power reception side of the contactless electric power supply mechanism for a rotary table according to the present invention. In FIG. 2, when current is caused to flow from an AC power supply being the electric power supply source 24, the current enters a bridge rectifier circuit to become a main power supply 38, and also enters a bridge rectifier circuit to become a gate circuit power supply 42. The current flows through the fixed-side primary coil 22, and thus an induced current is induced in the rotary table-side secondary coil 26 on the electric power reception side illustrated in FIG. 3. In this manner, current flows to the load 28, which is connected to the rotary table-side secondary coil 26.

Further, in the example illustrated in FIG. 3, as clearly illustrated in FIG. 3, the contactless electric power supply mechanism for a rotary table further comprises a first resonant capacitor 32 connected to the fixed-side primary coil 22, and a second resonant capacitor 34 connected to the rotary table-side secondary coil 26. When the first resonant capacitor 32 and the second resonant capacitor 34 are provided as described above, the induced current is increased, and the length of a gap D1, which is obtained by separating the fixed-side primary coil 22 and the rotary table-side secondary coil 26 from each other by a predetermined distance, can be increased. A transfer characteristic does not greatly vary even when the frequencies of the primary-side resonance circuit and the secondary-side resonance circuit illustrated in FIG. 3 vary by about 10%.

In the example of FIG. 1, the load 28 and the rotary table-side secondary coil 26 are connected to each other via electric wires 27. The electric wires 27 are exposed to the outside, but the electric wires 27 may also be drawn into the rotary table 18.

The gap D1, which is obtained by separating the fixed-side primary coil 22 and the rotary table-side secondary coil 26 from each other by the predetermined distance, may have a length of from about 0.1 mm to about 100 mm. When the first resonant capacitor 32 and the second resonant capacitor 34 are provided, electric power can be transferred even when the gap D1 is set to have a length of about 150 mm.

Figure 4:
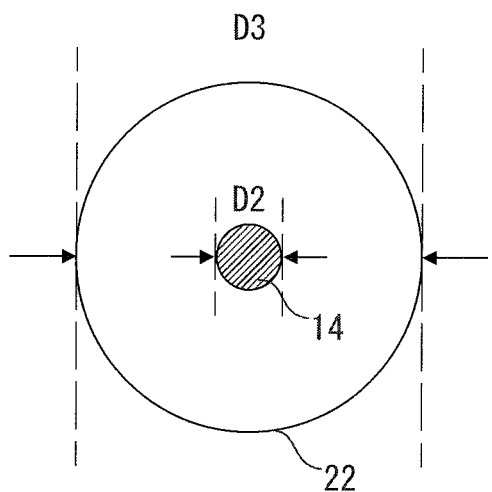
FIG. 4 is a schematic plan view for illustrating a rotary shaft of the rotary table and a fixed-side primary coil wound around the rotary shaft.

FIG. 4 is a schematic plan view for illustrating the rotary shaft 14 of the rotary table 18 and the coil (fixed-side primary coil 22) provided around the rotary shaft 14. In the example of FIG. 4, a coil having an inner diameter of 200 mm was provided around the rotary shaft 14 made of SUS and having a diameter of 45 mm. The rotary shaft 14 was inserted into and removed from the coil to allow current from the high-frequency power supply to flow through the coil. In this manner, the input voltage of the high-frequency power supply and an amount of change of the current were examined. As a result, the heat generation amount of the rotary shaft 14 was increased too much when the input voltage exceeded 60 V. Therefore, in the example of FIG. 4, an input voltage of 60 V or less is preferred to be used.

Further, the ratio of a diameter D2 of the rotary shaft 14 to an inner diameter D3 of the fixed-side primary coil 22 is preferred to be, for example, 1:4.4 or more so that the heat generation amount is not increased too much.

Figure 5:
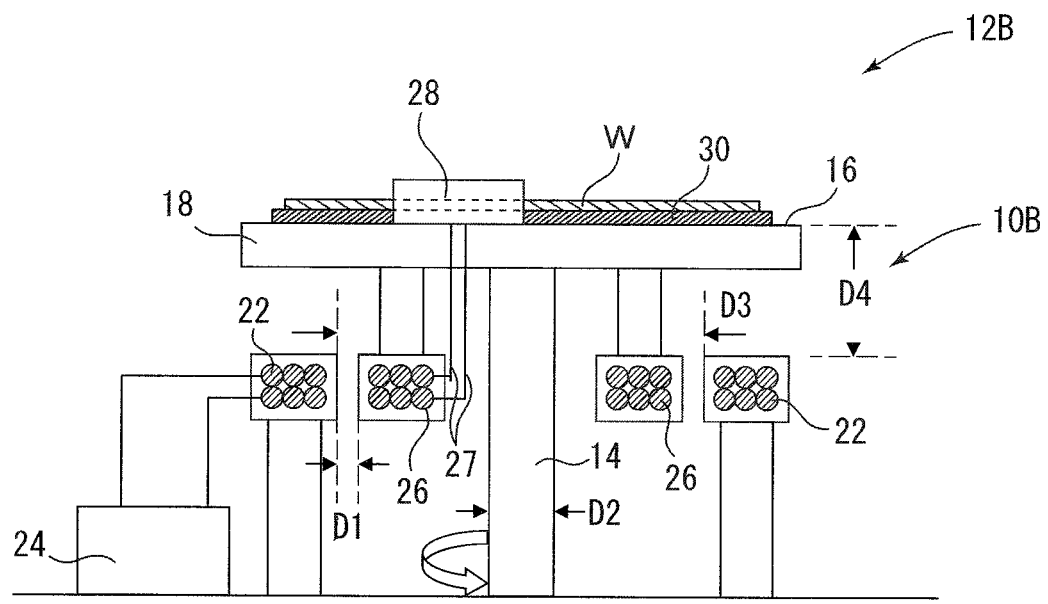
FIG. 5 is a schematic diagram for illustrating a wafer rotating and holding device comprising another embodiment of a contactless electric power supply mechanism for a rotary table according to the present invention.

FIG. 5 is a diagram for illustrating a wafer rotating and holding device 12B comprising a contactless electric power supply mechanism 10B for a rotary table according to another embodiment of the present invention. In FIG. 5, the fixed-side primary coil 22 corresponds to the coil of the electric power transmission side, and the rotary table-side secondary coil 26 corresponds to the coil of the electric power reception side. In FIG. 5, there is illustrated an example in which the rotary table-side secondary coil 26 is provided inside the fixed-side primary coil 22 so as to be separated from the fixed-side primary coil 22 by a predetermined distance. The example of FIG. 5 has the same configuration as that of FIG. 1 except that the rotary table-side secondary coil 26 is provided inside the fixed-side primary coil 22 so as to be separated from the fixed-side primary coil 22 by a predetermined distance and a shield plate 30 made of metal is placed.

The shield plate 30 is a shield plate for preventing occurrence of electromagnetic induction in the wafer W held on the rotary table 18 of the wafer rotating and holding device 12B. As the shield plate 30, an iron plate can be used, for example. As illustrated in FIG. 5, a distance D4 between the fixed-side primary coil 22 and the shield plate 30 being a metal structure is preferred to be 50 mm or more. The reason therefor is that a heat generation amount of the shield plate 30 is increased by current flowing into the shield plate 30 when the fixed-side primary coil 22 and the wafer W are positioned too close to each other.

Figure 6:
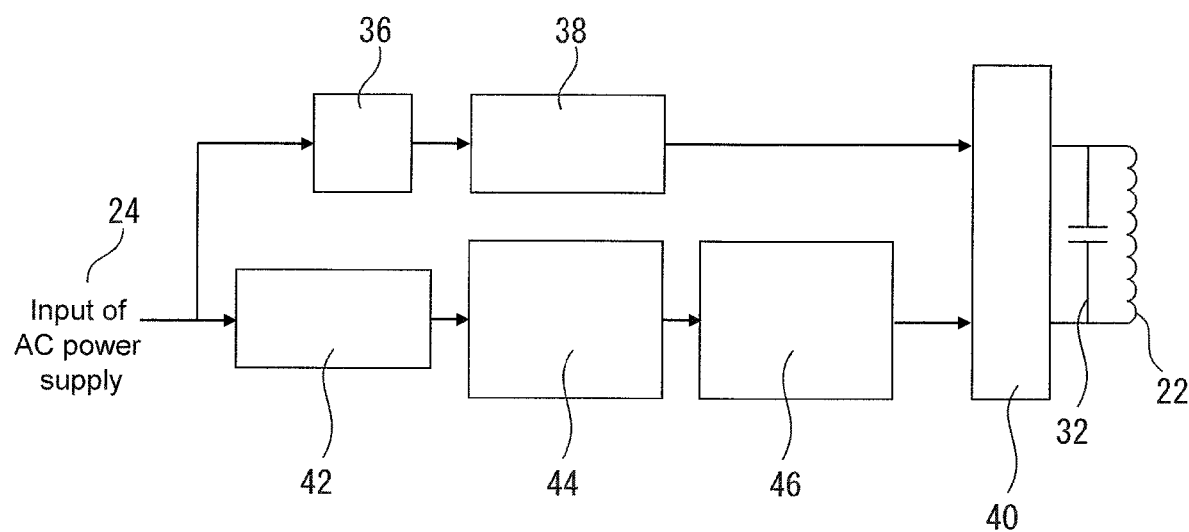
FIG. 6 is another block circuit diagram of the electric power transmission side of the contactless electric power supply mechanism for a rotary table according to the present invention.

FIG. 6 is another block circuit diagram of the electric power transmission side of the contactless electric power supply mechanism for a rotary table according to one embodiment of the present invention. In FIG. 6, a main voltage regulator, a main power supply, and a power device are denoted by reference symbols 36, 38, and 40, respectively. Further, a gate circuit power supply, a gate circuit power-saving switching circuit, and a gate zero-voltage assurance switching circuit are denoted by reference symbols 42, 44, and 46, respectively. Specifically, in this circuit, current from the electric power supply source 24 enters the main power supply 38 from the main voltage regulator 36 to enter the power device 40, and also enters the gate circuit power supply 42, the gate circuit power-saving switching circuit 44, and the gate zero-voltage assurance switching circuit 46 to enter the power device 40. In this configuration, current flows to the fixed-side primary coil 22 being a work coil in this manner.

In the configuration of the basic circuit illustrated in FIG. 2, there are problems in heat generation and decrease in resistance value because of large electric power consumption due to the resistance of the gate circuit. To address those problems, in the example illustrated in the block circuit diagram of FIG. 6, a switching circuit configured to turn off the power supply when a gate drive is not required is added, with the result that a decrease in resistance of the gate can be achieved at the same time. Further, a residual voltage of the gate circuit is increased along with an increase in current flowing through a field effect transistor (FET). For that reason, the zero-voltage assurance circuit for a time when the gate is turned off is added. With this circuit, malfunction of the high-frequency power supply due to load variation and voltage variation is solved.

In addition, a contactless electric power supply method for a rotary table according to one embodiment of the present invention involves supplying electric power to the load 28 with use of the contactless electric power supply mechanism for a rotary table described above. In this manner, according to one embodiment of the present invention, it is possible to contactlessly supply electric power to the load connected to the rotary table of the wafer rotating and holding device.

REFERENCE SIGNS LIST 10A, 10B: contactless electric power supply mechanism for a rotary table of the present invention, 12A, 12B: wafer rotating and holding device, 14: rotary shaft, 16: upper surface, 18: rotary table, 20: drive motor, 22: fixed-side primary coil, 24: electric power supply source, 26: rotary table-side secondary coil, 27: electric wire, 28: load, 30: shield plate, 32: first resonant capacitor, 34: second resonant capacitor, 36: main voltage regulator, 38: main power supply, 40: power device, 42: gate circuit power supply, 44: gate circuit power-saving switching circuit, 46: gate zero-voltage assurance switching circuit, D1: gap, D2: diameter, D3: inner diameter, D4: distance, W: wafer

The invention claimed is:

1. A contactless electric power supply mechanism for a rotary table of a wafer rotating and holding device, the contactless electric power supply mechanism comprising:
   a rotary shaft;
   a rotary table placed on an end of the rotary shaft, the rotary table being configured to hold a wafer on an upper surface of the rotary table;
   a drive motor configured to supply motive power to the rotary shaft;
   a fixed-side primary coil wound around the rotary shaft;
   an electric power supply source connected to the fixed-side primary coil;
   a rotary table-side secondary coil provided so as to correspond to the fixed-side primary coil and be separated from the fixed-side primary coil by a predetermined distance, the rotary table-side secondary coil being mounted to the rotary table; and
   a load connected to the rotary table-side secondary coil, wherein the load is supplied with electric power by electromagnetic induction via the rotary table-side secondary coil.

2. A contactless electric power supply mechanism according to claim 1, wherein the load comprises a wafer processing mechanism for performing processing on the wafer placed on the rotary table.

3. A contactless electric power supply mechanism according to claim 1, further comprising:
   a first resonant capacitor connected to the fixed-side primary coil; and
   a second resonant capacitor connected to the rotary table-side secondary coil.

4. A contactless electric power supply method for a rotary table, the contactless electric power supply method comprising:
   providing a contactless electric power supply mechanism comprising:
      a rotary shaft;
      a rotary table placed on an end of the rotary shaft, the rotary table being configured to hold a wafer on an upper surface of the rotary table;

a drive motor configured to supply motive power to the rotary shaft;

a fixed-side primary coil wound around the rotary shaft;

an electric power supply source connected to the fixed-side primary coil;

a rotary table-side secondary coil provided so as to correspond to the fixed-side primary coil and be separated from the fixed-side primary coil by a predetermined distance, the rotary table-side secondary coil being mounted to the rotary table; and a load connected to the rotary table-side secondary coil; supplying electric power to the load via the contactless electric power supply mechanism.

5. A wafer rotating and holding device, comprising:
a contactless electric power supply mechanism comprising:

a rotary shaft;

a rotary table placed on an end of the rotary shaft, the rotary table being configured to hold a wafer on an upper surface of the rotary table;

a drive motor configured to supply motive power to the rotary shaft;

a fixed-side primary coil wound around the rotary shaft;

an electric power supply source connected to the fixed-side primary coil;

a rotary table-side secondary coil provided so as to correspond to the fixed-side primary coil and be separated from the fixed-side primary coil by a predetermined distance, the rotary table-side secondary coil being mounted to the rotary table; and a load connected to the rotary table-side secondary coil, wherein the load is supplied with electric power by electromagnetic induction via the rotary table-side secondary coil.

6. A wafer rotating and holding device according to claim 5, further comprising a spin processing mechanism.

7. A wafer rotating and holding device according to claim 5, wherein the load comprises a wafer processing mechanism for performing processing on the wafer placed on the rotary table.

8. A wafer rotating and holding device according to claim 5, wherein the contactless electric power supply mechanism further comprises:

a first resonant capacitor connected to the fixed-side primary coil; and a second resonant capacitor connected to the rotary table-side secondary coil.

9. A wafer rotating and holding device according to claim 7, wherein the contactless electric power supply mechanism further comprises:

a first resonant capacitor connected to the fixed-side primary coil; and a second resonant capacitor connected to the rotary table-side secondary coil.

10. A contactless electric power supply method according to claim 4, wherein the load comprises a wafer processing mechanism for performing processing on the wafer placed on the rotary table.

11. A contactless electric power supply method for a rotary table according to claim 4, wherein the contactless electric power supply mechanism further comprises:

a first resonant capacitor connected to the fixed-side primary coil; and a second resonant capacitor connected to the rotary table-side secondary coil.

12. A contactless electric power supply method according to claim 10, wherein the contactless electric power supply mechanism further comprises:

a first resonant capacitor connected to the fixed-side primary coil; and a second resonant capacitor connected to the rotary table-side secondary coil.

13. A contactless electric power supply mechanism according to claim 2, further comprising:

a first resonant capacitor connected to the fixed-side primary coil; and a second resonant capacitor connected to the rotary table-side secondary coil.

* * * * *